United States Patent
Zhao et al.

[11] Patent Number: 6,146,958
[45] Date of Patent: Nov. 14, 2000

[54] METHODS FOR MAKING VLSI CAPACITORS AND HIGH Q VLSI INDUCTORS USING METAL-FILLED VIA PLUGS

[75] Inventors: Ji Zhao; Chih Sieh Teng, both of San Jose, Calif.

[73] Assignee: National Semiconductor Corporation, Santa Clara, Calif.

[21] Appl. No.: 09/158,219

[22] Filed: Sep. 22, 1998

Related U.S. Application Data

[62] Division of application No. 08/726,311, Oct. 2, 1996, Pat. No. 5,861,647.

[51] Int. Cl.[7] ................................................. H01L 21/20
[52] U.S. Cl. ........................ 438/381; 438/622; 438/637
[58] Field of Search ................................... 438/381, 637, 438/622, 675; 257/531, 528, 535, 296, 300, 758

[56] References Cited

U.S. PATENT DOCUMENTS

| | | | |
|---|---|---|---|
| 4,780,795 | 10/1988 | Meinel | 361/402 |
| 5,294,836 | 3/1994 | Kishi | 257/758 |
| 5,305,519 | 4/1994 | Yamamoto et al. | 29/852 |
| 5,391,914 | 2/1995 | Sullivan et al. | 257/758 |
| 5,404,046 | 4/1995 | Matsumoto et al. | 257/758 |
| 5,431,987 | 7/1995 | Ikeda | 428/209 |
| 5,446,311 | 8/1995 | Ewen et al. | 257/531 |
| 5,471,093 | 11/1995 | Cheung | 257/758 |
| 5,479,054 | 12/1995 | Tottori | 257/758 |
| 5,500,558 | 3/1996 | Hayashide | 257/758 |
| 5,539,247 | 7/1996 | Cheung et al. | 257/758 |
| 5,610,433 | 3/1997 | Merrill et al. | 257/531 |
| 5,631,478 | 5/1997 | Okumura | 257/758 |
| 5,640,049 | 6/1997 | Rostoker et al. | 257/758 |
| 5,656,849 | 8/1997 | Burghartz et al. | 257/528 |
| 5,846,876 | 12/1998 | Bandyopadhyay et al. | 438/622 |

OTHER PUBLICATIONS

R.B. Merrill et al., "Optimization of High Q Integrated Inductors for Multi–Level Metal CMOS", IEDM 95–983, pp. 38.7.1–38.7.4.

P.R. Gray et al., "Future Directions in Silicon ICs for RF Personal Communications", Electrical Engineering & Computer Sciences, University of California Berkeley.

*Primary Examiner*—Donald L. Monin, Jr.
*Attorney, Agent, or Firm*—Limbach & Limbach LLP

[57] ABSTRACT

Disclosed are methods of making inductors and capacitors, comprising filling a via in a dielectric disposed between two metal layers with a metal plug. The plug comprises tungsten, aluminum or copper and extends the length of the metal layers. The plug connects the two metal layers to form the inductor. Two plugs can be formed so as to connect the two metal layers so as to form a parallel plate capacitor.

10 Claims, 9 Drawing Sheets

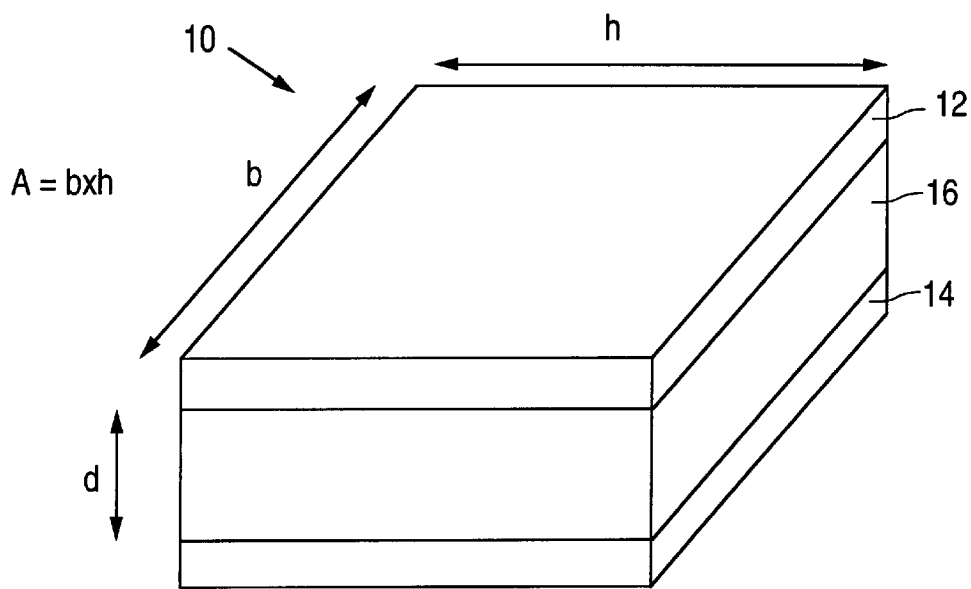
FIGURE 1
(PRIOR ART)
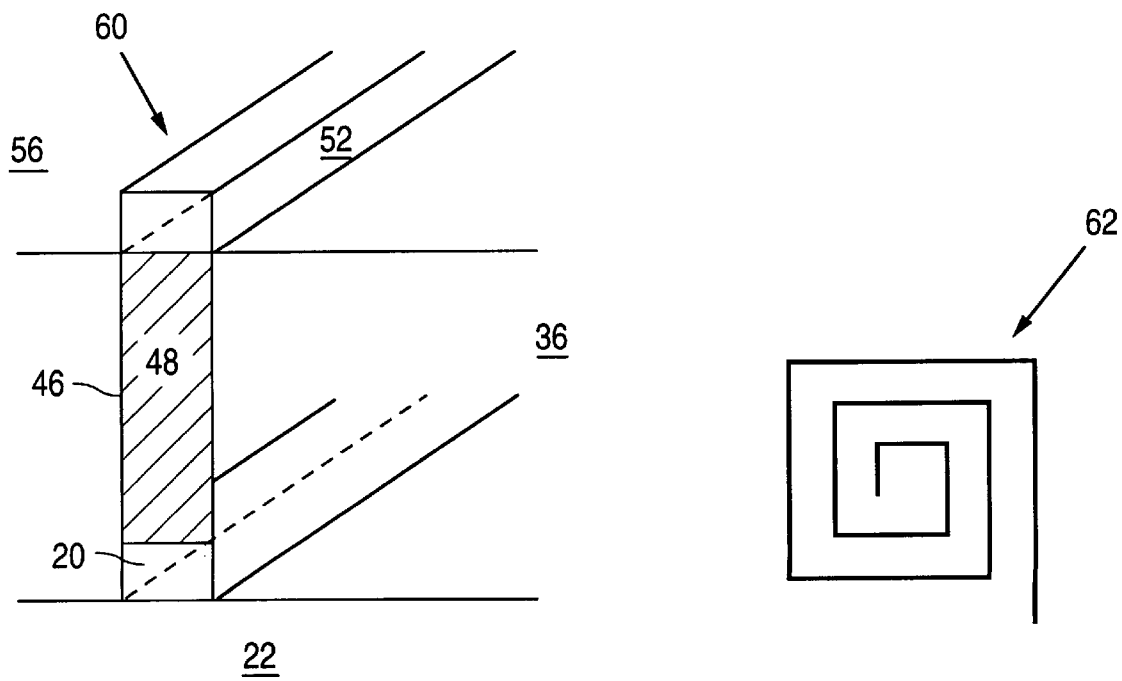
FIGURE 9   FIGURE 10

METHODS FOR MAKING VLSI CAPACITORS AND HIGH Q VLSI INDUCTORS USING METAL-FILLED VIA PLUGS

This application is a divisional of U.S. application Ser. No. 08/726,311 filed Oct. 2, 1996, now U.S. Pat. No. 5,861,647.

BACKGROUND OF THE INVENTION

1. Field of the Invention

The present invention relates to methods for making high Q inductors and highly efficient capacitors for VLSI circuits using metal-filled via plugs.

2. Description of the Related Art

Capacitors, especially parallel plate capacitors, are one of the most important components in VLSI circuits. As shown in FIG. 1, conventional capacitors 10 include two parallel plates 12, 14 horizontally oriented, i.e., parallel to the plane of the chip, and separated by a dielectric 16. Capacitance is defined as $$C = \epsilon \frac{A}{d}$$

where A represents the area of one of the plates and d is the dielectric thickness between the plates and $\epsilon$ is the dielectric constant. To increase capacitance, one must either increase A or decrease d or both. However, with scaling to smaller geometries, increasing A is not practicable. Also, decreasing d tends to increase process complexity.

Another important component in VLSI circuits is the inductor. High quality factor (Q) inductors are very desirable especially for high frequency applications such as wireless communications. Q is defined as $$\omega_0 \left( \frac{L}{R_m + R_d + R_{rad}} \right)$$

where $\omega_0$ is the resonant angular frequency of the inductor, $R_m$ is the resistance of metal wire, $R_d$ is the equivalent resistance due to dielectric loss and $R_{rad}$ is the equivalent resistance due to RF emission from the inductor, L is the inductance of a solenoid is defined as $$L = \pi \mu r^2 n^2 l$$

where $\mu$ is the permeability of the dielectric, r is the solenoid radius, l is the solenoid length and n is the number of loops per length of solenoid.

Conventionally, inductors are formed from a metal in a spiral, although circular and square inductor layouts are also known.

From the above relationships, it can be seen that Q increases with increasing L and decreasing resistance. Metal resistance $R_m$ may be decreased in spirals having different layers of metal connected in parallel through vias. Alternatively, putting a spiral in a hole etched on the substrate surface reduces $R_d$, but such a process is relatively complicated.

Another technique for making high Q inductors is described by Merrill, et al. "Optimization of High Q Integrated Inductors for Multi-level Metal CMOS", IEEE IEDM Digest, 1995, p. 983–986. These authors describe a technique for making series coil/spiral inductors with three-layer metal CMOS processes.

In fabricating contacts and multi-layer interconnects for integrated circuit structures for CMOS technology, it is known to fill openings formed in a dielectric with metal. These processes are commonly referred to as via plug processes, but have not been used to date for fabricating other structures such as inductors or capacitors.

It remains desirable to have methods of making high Q inductors and highly efficient capacitors for use in VLSI technologies.

SUMMARY OF THE INVENTION

The present invention solves these and other problems by providing multiple metal layer inductors and capacitors that include metal-filled via plugs and methods for making the inductors and capacitors.

Methods for making a high Q inductor on an integrated circuit in accordance with the invention include: depositing a first metal layer over a first dielectric; patterning and etching the first metal layer; depositing a second dielectric layer over the first metal layer; planarizing the second dielectric layer; patterning and etching the second dielectric to form an opening therein; filling the opening in the second dielectric with a metal to form a metal plug having a length that extends the length of the first metal layer; depositing a second metal layer on the second dielectric layer and over the plug; and patterning and etching the second metal layer to match the length of the first metal layer.

Methods for making a VLSI capacitor on an integrated circuit in accordance with the invention include depositing a first metal layer over a first dielectric; patterning and etching the first metal layer; depositing a second dielectric layer over the first metal layer; planarizing the second dielectric layer; patterning and etching the second dielectric to form at least two openings therein; filling the openings in the second dielectric with a metal to form at least two metal plugs, each of the plugs being equal in length as the first metal layer; depositing a second metal layer on the second dielectric layer and over the plugs; and patterning the second metal layer.

The metal of plug(s) can be tungsten, aluminum or copper. The plugs may be of rectangular or circular configuration.

BRIEF DESCRIPTION OF THE DRAWINGS

The present invention will be further described in connection with the drawings of the following figures in which like reference numeral refer to like elements and in which:

FIG. 1 is a sketch of a conventional parallel plate capacitor;

FIG. 9 illustrates a cross sectional view of a high Q inductor fabricated according to the present invention;

FIG. 10 illustrates a plan view of a high Q spiral inductor fabricated according to the present invention;

DETAILED DESCRIPTION OF THE INVENTION

Methods according to the present invention are described with reference to FIGS. 2–12. Generally, methods according to the present invention use via plug processing to manufacture inductors and capacitors. Either component may be formed on a chip, for example, as over NMOS or PMOS transistors. The steps of these methods are discussed in turn below.

Deposition of First Metal Over First Dielectric

Figure 2:
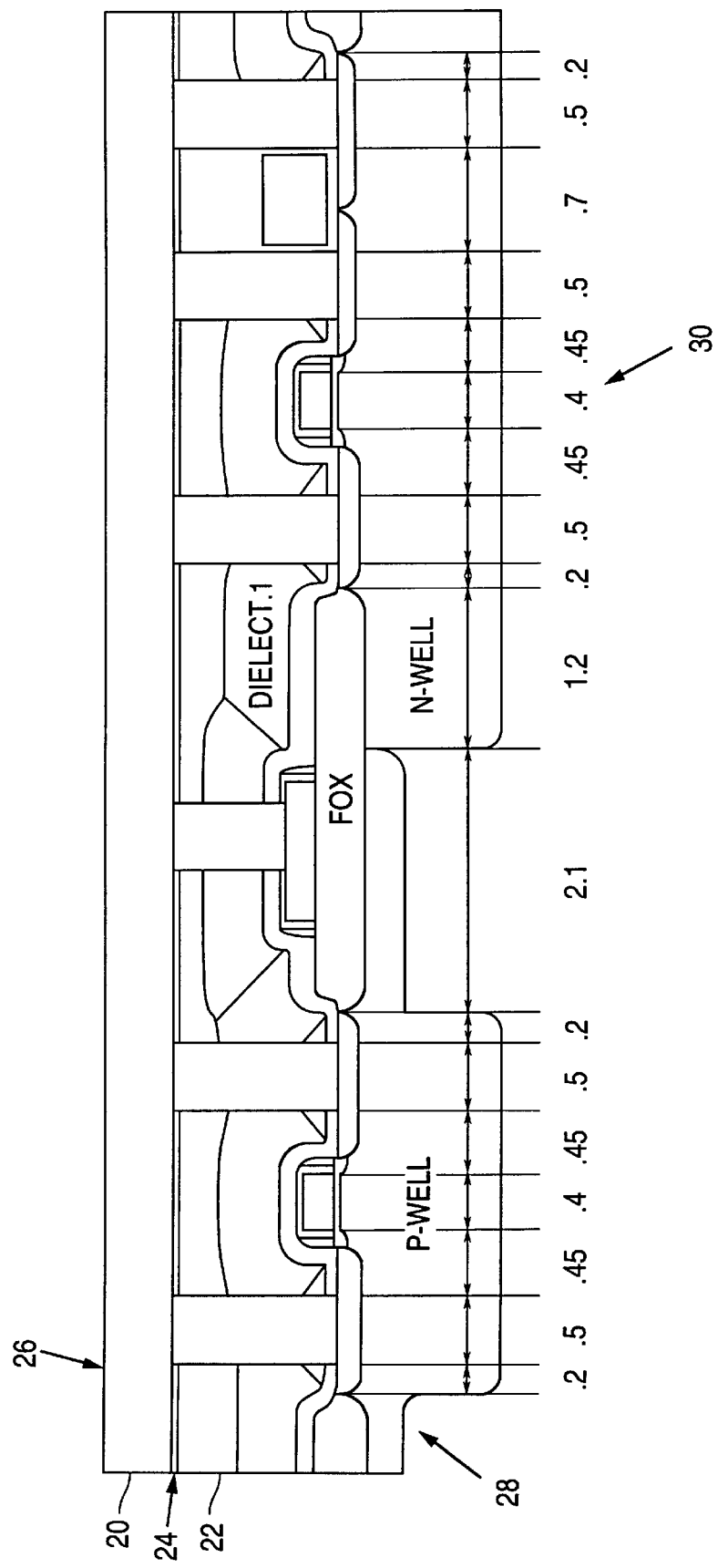
FIGS. 2 through 8 illustrate profiles of an inductor at various stages of fabrication according to methods according to the present invention.

A first metal layer 20 is deposited over a first dielectric 22, for example, by sputtering or other conventional method. The first metal is suitably aluminum or copper. The profile of the component at this stage of processing is shown in FIG. 2.

It may be desirable to sputter clean the first dielectric prior to deposition of the first metal. Also, it may be desirable to precede deposition of the first metal with a thin underlayer 24 of material such as TiN to improve via conductivity and to follow the first metal deposition with a thin (e.g., ≈250 Å) TiN layer 26 as a thin anti-reflective coating. In addition, underlying NMOS 28 and PMOS 30 devices previously formed on the chip are also shown.

Patterning of First Metal

Figure 3:
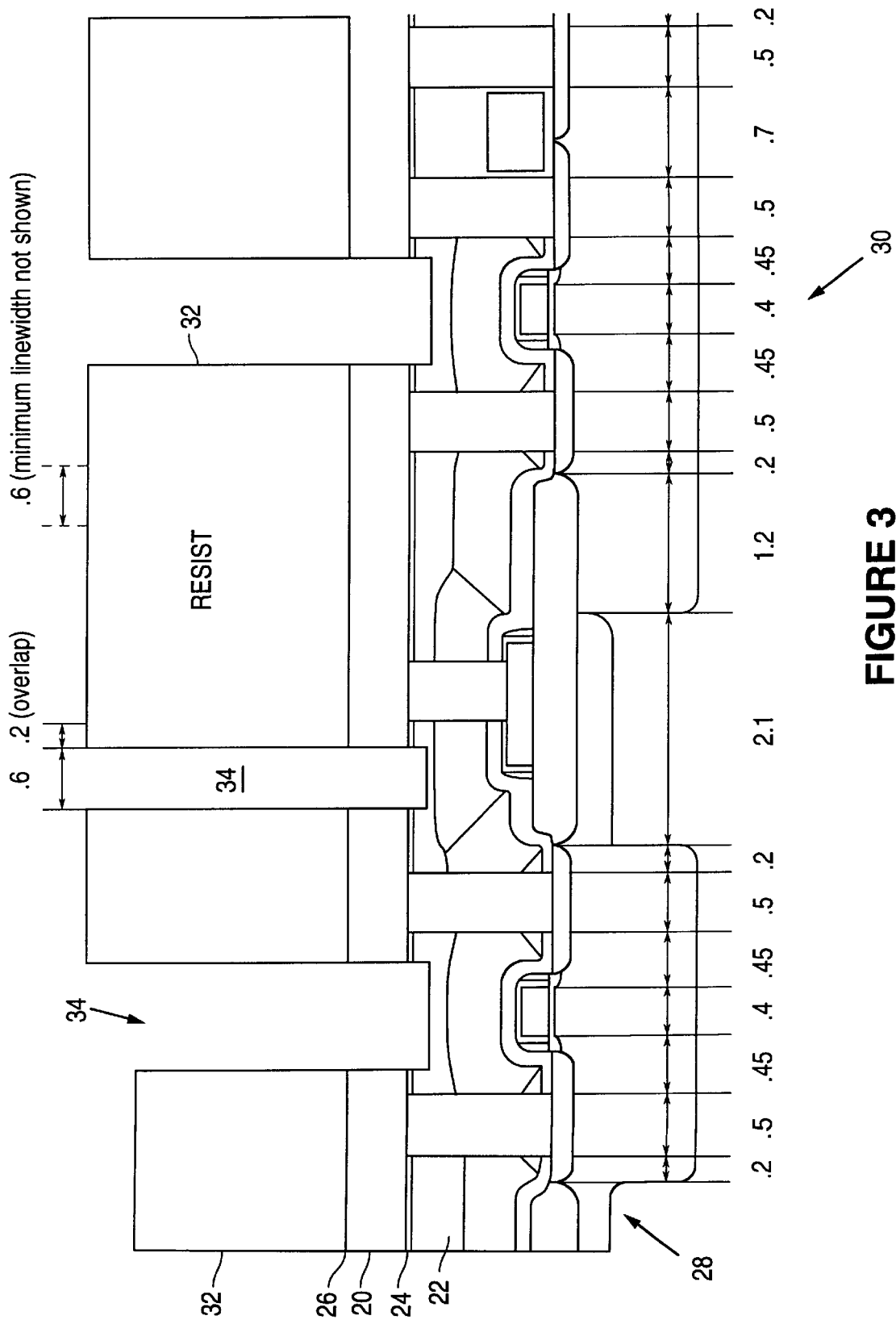

The profile at this stage of processing is shown in FIG. 3. The patterning and etching of the first metal layer 20 may be accomplished by conventional photolithographic methods of photoresist 32 and metal etching techniques creates a topography 34 in the first metal layer 20 over which a second dielectric is to be deposited.

Second Dielectric Deposition

Figure 4:
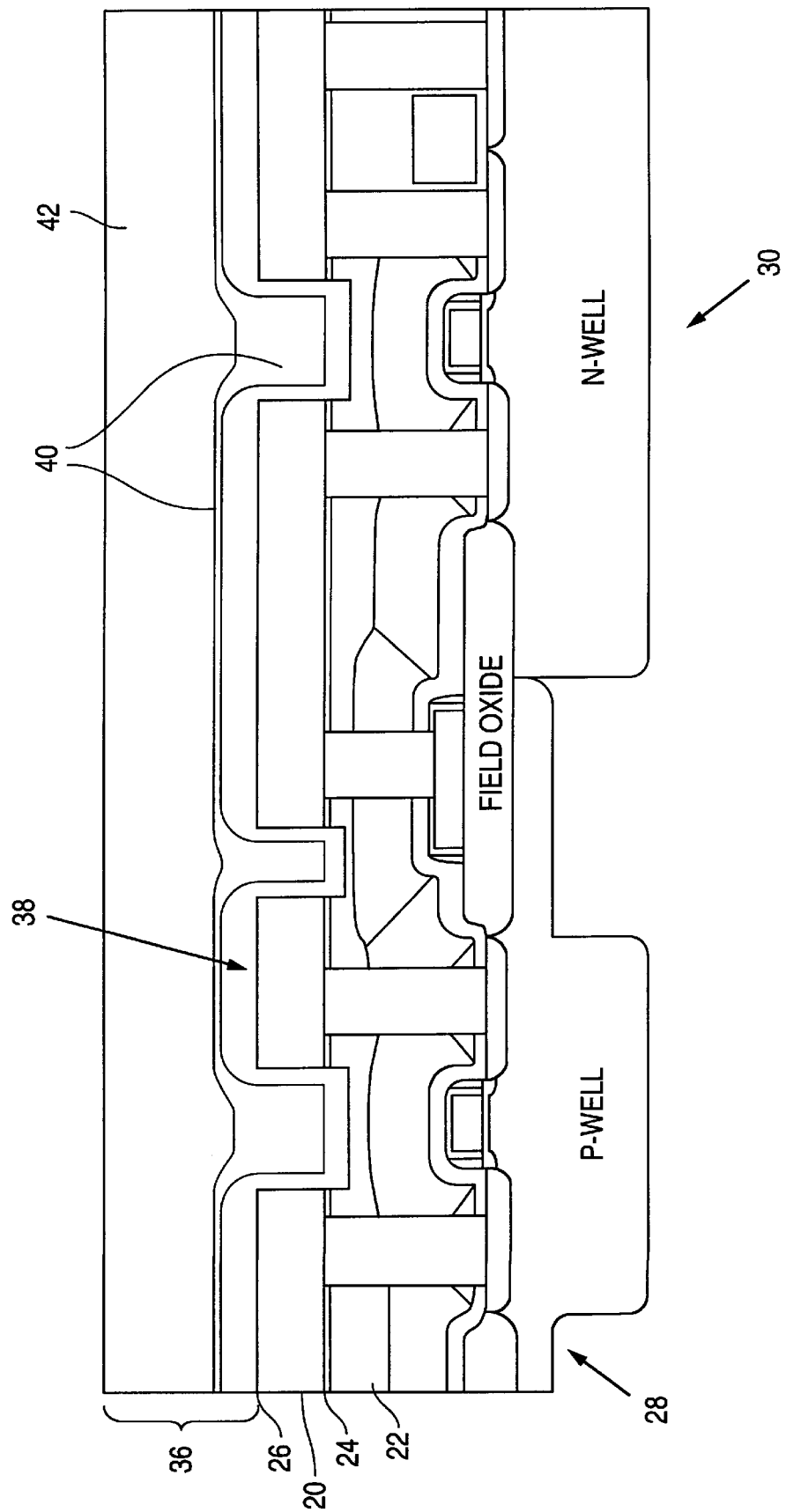

FIG. 4 illustrates the profile after a deposition of a second dielectric 36 over the first metal layer 20. This deposition may involve several steps, for example, depositing a TEOS base layer 38 (e.g, 3000 Å) followed by a SOG spin layer 40 (4000 Å) and a TEOS cap layer 42 (16000 Å). The second dielectric 36 may be planarized, for example, by chemical mechanical polishing (CMP) and then masked and etched to form one or more openings which will be plugged with metal as described below.

Via Plug Formation

Figure 5:
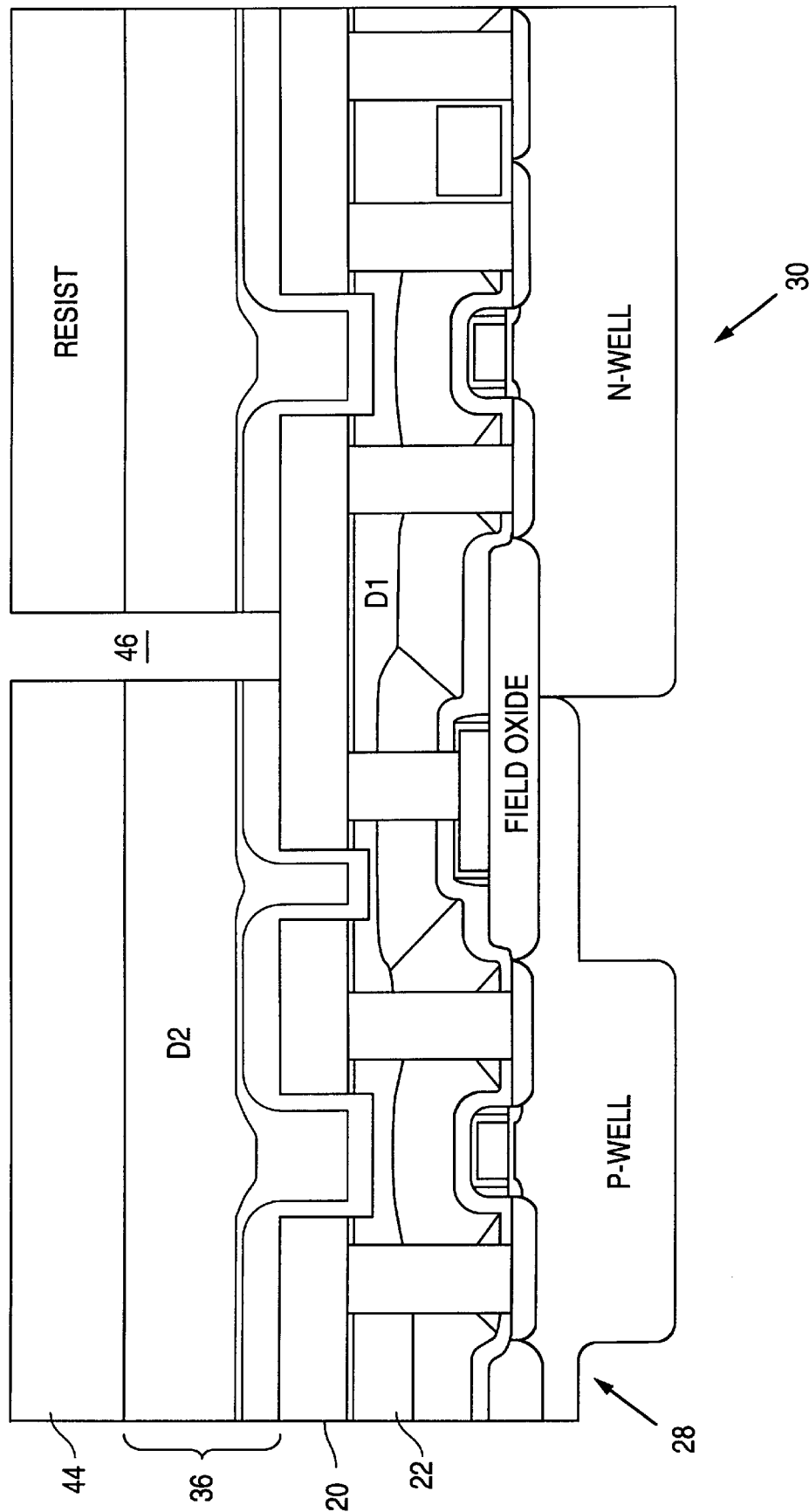
Figure 6:
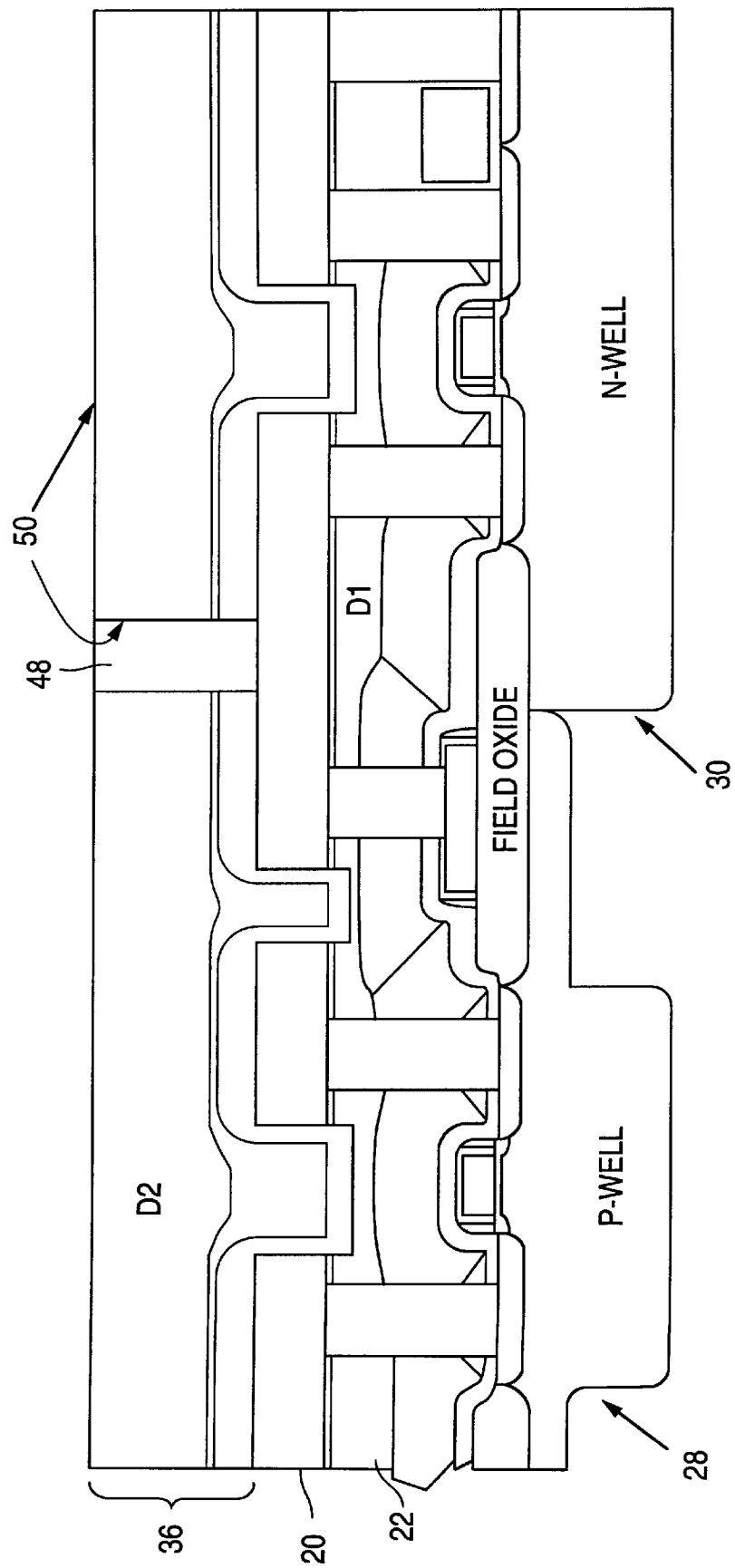

The profile after masking (with resist 44) and etching second dielectric layer 36 is shown in FIG. 5. As can be seen, each via 46 extends from the top of the first metal layer 20 through the second dielectric layer 36. Note that the width "w" of the plug (FIG. 9) should be no greater than the width of the etched first metal. Also, the length 1 of the metal plug should extend the length of the etched first metal. As shown in FIGS. 6 and 9, each via 46 is then plugged with a metal plug 48, for example, tungsten, aluminum, or copper, and may include a barrier or a liner 50 (e.g., 300 ÅTi/TiN) which may also extend along the second dielectric layer 38. The metal plug 48 in each via 46 is formed by metal etch back to remove excess metal adjacent to (outside of) via 46.

Figure 11:
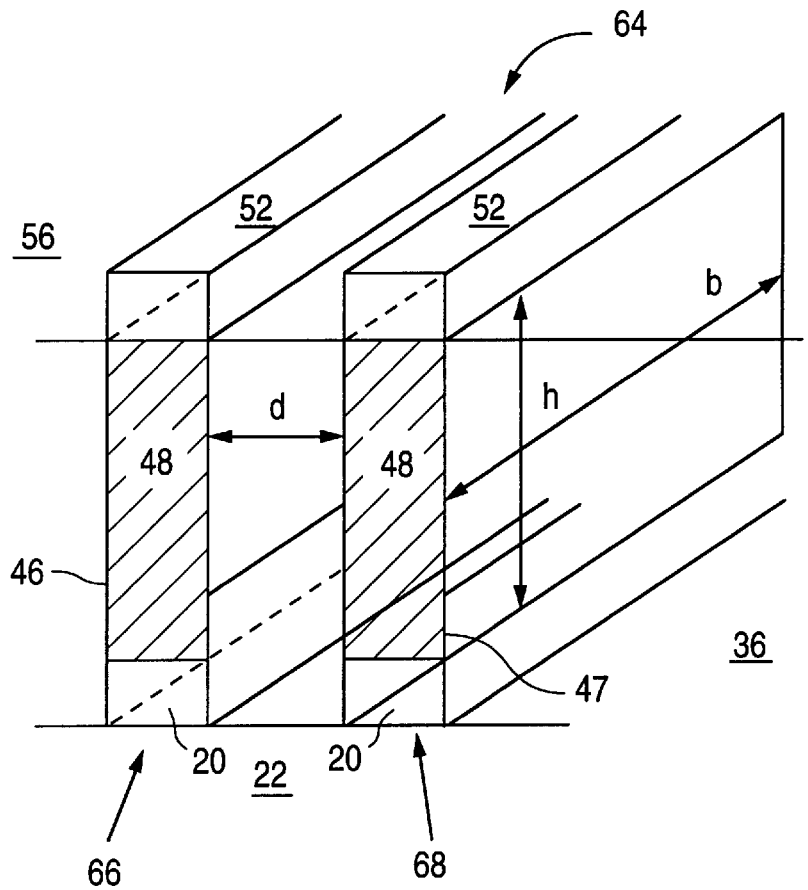
FIG. 11 illustrates a cross sectional view of a parallel plate capacitor fabricated according to the present invention.

For making an inductor, only one metal plug 48 is needed between the first and second metal layers. The length of the plug should extend the length of the first and second metal layers. For capacitors, two adjacent vias 46, 47 are formed side by side in this step (as shown in FIG. 11) and filled with metal plugs 48. Thus, capacitor plates 66, 68 (separated by dielectric) are formed from metal plugs 48 and the plates are arranged vertically, i.e., perpendicular to the plane of the chip.

Second Metal Deposition

Figure 7:
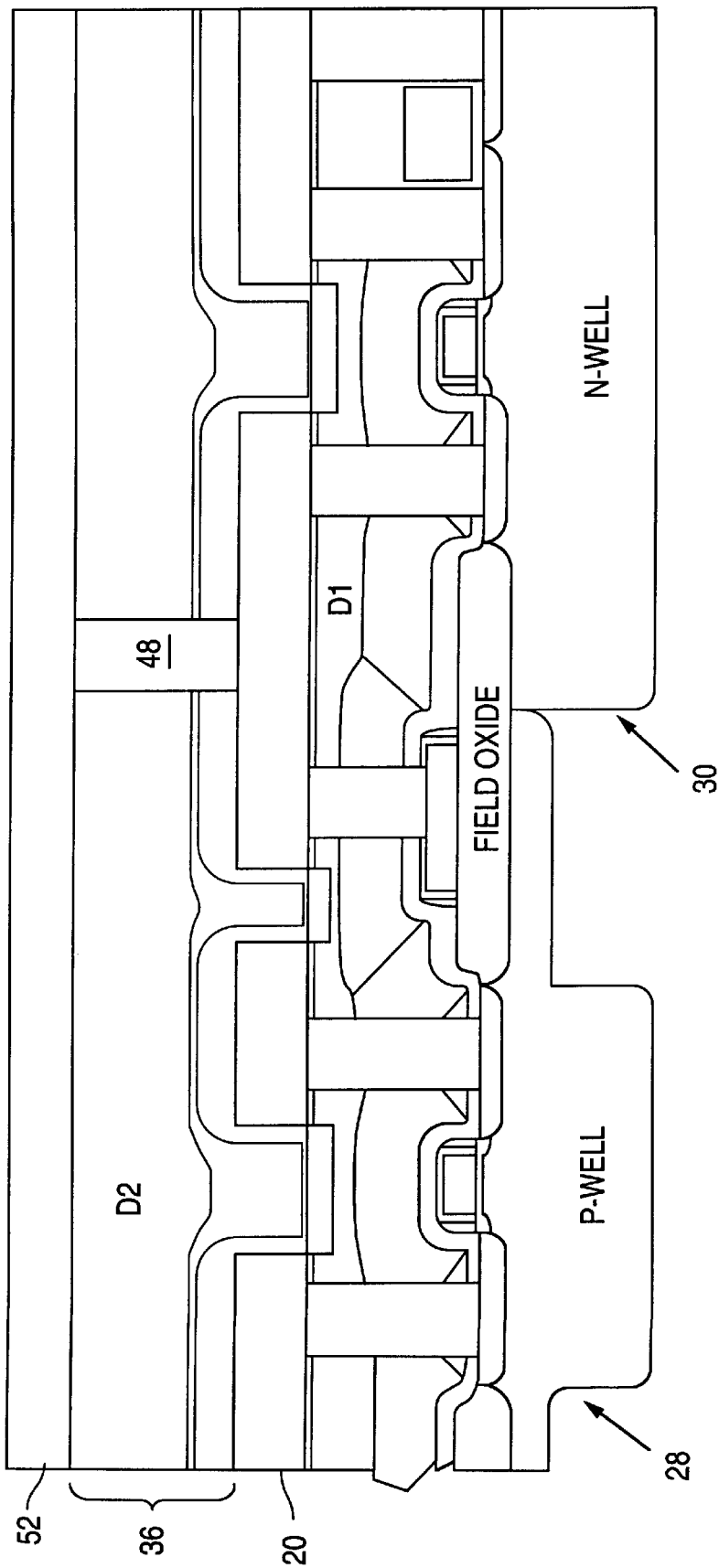
Figure 8:
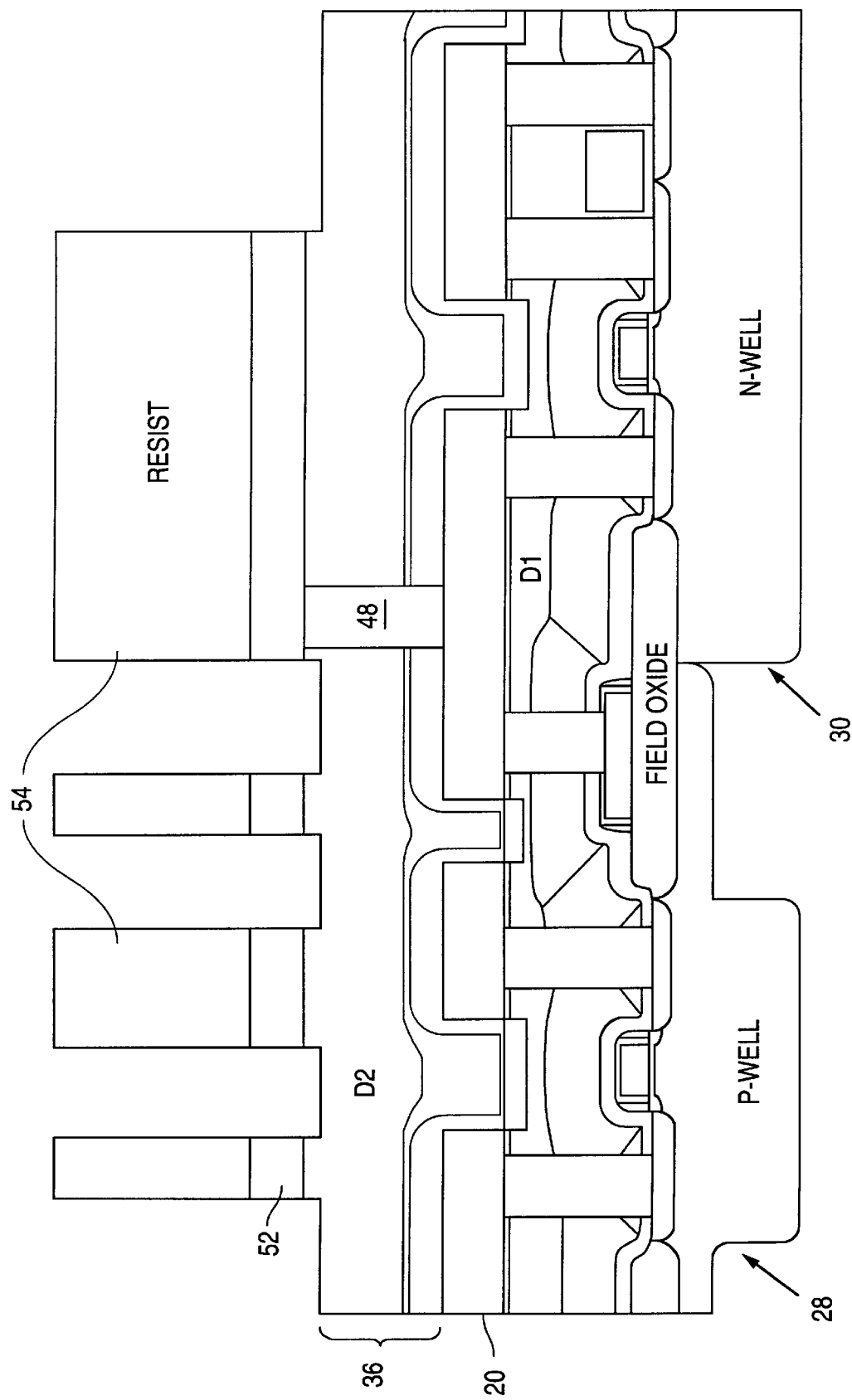

A second metal layer 52, for example, 4500Å aluminum or copper, is deposited conventionally, as shown in FIG. 7. The second metal layer 52 is connected to the first metal layer 20 through metal plug(s) 48, thereby forming an inductor or a capacitor according to the present invention. The second metal layer 52 can then be masked (with resist 54) and etched, as shown in FIG. 8 according to the desired layout. After etching, the second metal layer should have the same length as the etched first metal layer.

Inductors formed according to the present invention (e.g., as in FIG. 9) have much lower resistance compared to conventionally fabricated inductors, because the metal plug shunts the first metal to the second metal. In addition, electric field lines are substantially retained within the inductors prepared according to the present invention (rather than being lost to the substrate) because of the increased height of the wire formed by the first and second metals and the metal plug. The equivalent resistance of the inductor due to the emission of RF electromagnetic field is dramatically reduced and a high Q performance is obtained.

Methods according to the present invention may be utilized to construct spiral inductor wires 62 using a layout such as shown in FIG. 10.

FIG. 11 shows a parallel plate capacitor 64 formed according to the present invention. Note that in contrast to conventional horizontal parallel plate capacitors (as in FIG. 1), the capacitor plates 66, 68 are formed from the two metal layers 20, 52 and the metal plugs 48 in adjacent vias 46, 47. The plates are oriented vertically since they are formed from via plugs 48 filled in the second dielectric 36.

Figure 12:
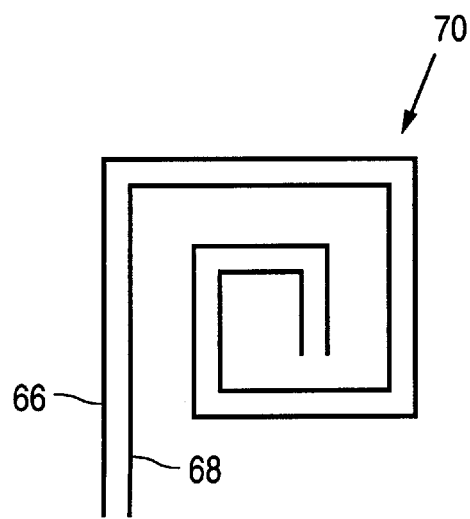
FIG. 12 illustrates a plan view of a parallel plate capacitor fabricated according to the present invention.

FIG. 12 illustrates a practical layout 70 for fabricating capacitors according to the present invention that permits efficient use of surface area across a wafer. Although plates 66, 68 form a rectangular shape as shown in FIG. 12, the layout geometry of the plates may take another form such as circular or elliptical.

Moreover, although the cross sections of inductors and capacitors according to the present invention are shown in the Figures as rectangular or square for convenience, the metal layers and the plugs need not be rectangular or square in cross section. Other geometries may be suitable as will be recognized by those of skill in the art.

While the present invention is disclosed with reference to the preferred embodiment and examples detailed above, it is to be understood that these examples are intended in an illustrative rather than limiting sense, as it is contemplated that many modifications within the scope and spirit of the invention will readily occur to those skilled in the art and the appended claims are intended to cover such variations.

We claim:

1. A method of making a high Q multiple layer inductor on an integrated circuit device, comprising the steps of:

depositing a second dielectric layer over a first patterned metal layer;

patterning and etching said second dielectric to form an opening therethrough;

filling said opening in said second dielectric with metal to form a metal plug therein, wherein said plug has a length greater than its width and said length is substantially the same as said first patterned metal layer;

depositing a second metal layer on said second dielectric layer and over said plug to; and patterning said second metal layer to form said inductor.

2. A method according to claim 1, wherein said plug comprises tungsten, aluminum or copper.

3. A high Q inductor fabricated according to the method of claim 1.

4. A method of making a parallel plate capacitor, comprising filling at least two vias in a dielectric between two metal layers with metal plugs, wherein each of said capacitor plates includes said two metal layers joined by said metal plugs and each of said metal plugs has a length greater than its width.

5. A method according to claim 4, wherein said plug comprises tungsten, aluminum or copper.

6. A capacitor fabricated according to the method of claim 4.

7. A capacitor fabricated according to the method of claim 4, wherein said plates are oriented perpendicular to a horizontal axis of a substrate upon which said capacitor is fabricated.

8. A method of making a VLSI parallel plate capacitor on an integrated circuit, comprising the step of forming a capacitor plate by: depositing a first metal layer over a first dielectric; patterning and etching said first metal layer; depositing a second dielectric layer over said first patterned metal layer; patterning and etching said second dielectric to form at least two openings therein; filling each said openings in said second dielectric with metal to form a metal plug therein wherein each of said plugs has a length greater than its width; depositing a second metal layer on said second dielectric layer and over said plugs; and patterning and etching said second metal layer.

9. A method according to claim 8, wherein said plug comprises tungsten, aluminum or copper.

10. A VLSI capacitor fabricated according to the method of claim 8.

* * * * *